(12) United States Patent
Alahautala et al.

(10) Patent No.: US 7,817,693 B2
(45) Date of Patent: Oct. 19, 2010

(54) METHOD AND A LASER DEVICE FOR PRODUCING HIGH OPTICAL POWER DENSITY

(75) Inventors: Taito Alahautala, Valkeakoski (FI); Erkki Lassila, Lempäälä (FI)

(73) Assignee: Cavitar Oy, Valkeakoski (FI)

( * ) Notice: Subject to any disclaimer, the term of this patent is extended or adjusted under 35 U.S.C. 154(b) by 273 days.

(21) Appl. No.: 10/515,023

(22) PCT Filed: May 20, 2003

(86) PCT No.: PCT/FI03/00386

§ 371 (c)(1), (2), (4) Date: Aug. 17, 2005

(87) PCT Pub. No.: WO03/098758

PCT Pub. Date: Nov. 27, 2003

(65) Prior Publication Data

US 2006/0098700 A1    May 11, 2006

(30) Foreign Application Priority Data

May 22, 2002    (FI) .................................. 20020968

(51) Int. Cl.
  *H01S 5/00* (2006.01)
  *H01S 3/09* (2006.01)

(52) U.S. Cl. .................. 372/50.12; 372/69; 372/50.124

(58) Field of Classification Search ............ 372/29.014, 372/34–36, 109, 75, 50, 108
See application file for complete search history.

(56) References Cited

U.S. PATENT DOCUMENTS

| | | |
|---|---|---|
| 4,820,010 A | 4/1989 | Scifres et al. |
| 5,592,333 A | 1/1997 | Lewis |
| 5,642,373 A | 6/1997 | Kamizato et al. |

(Continued)

FOREIGN PATENT DOCUMENTS

EP    1081819 A2    3/2001

(Continued)

OTHER PUBLICATIONS

Office action issued by Japanese patent office in counterpart application 2004-506142.

(Continued)

*Primary Examiner*—Minsun Harvey
*Assistant Examiner*—Patrick Stafford
(74) *Attorney, Agent, or Firm*—Venable LLP; Eric J. Franklin

(57) ABSTRACT

A method for producing high optical power density. Laser beams emitted from a plurality of laser bars are combined by spatial multiplexing to become substantially parallel with an optical axis. Each single laser bar includes one or more diode lasers. The slow axes of adjacent diode lasers of the single laser bar are substantially parallel with each other and the adjacent diode lasers emitting substantially to the same direction. The laser bars are arranged in two or more sectors around the optical axis. The width of the effective light-emitting near-field of at least one of the laser bars is less than 2.5 millimeters in the direction of the slow axis of the diode lasers of the at least one laser bar.

41 Claims, 10 Drawing Sheets

U.S. PATENT DOCUMENTS

| | | | |
|---|---|---|---|
| 5,715,270 A | 2/1998 | Zediker et al. | |
| 5,784,203 A | 7/1998 | Beckmann | |
| 5,793,783 A | 8/1998 | Endriz | |
| 5,805,784 A | 9/1998 | Crawford | |
| 5,808,323 A | 9/1998 | Spaeth et al. | |
| 5,808,803 A | 9/1998 | Ullmann et al. | |
| 5,825,551 A | 10/1998 | Clarkson et al. | |
| 5,877,898 A | 3/1999 | Hollemann et al. | |
| 5,887,096 A | 3/1999 | De et al. | |
| 5,986,794 A | 11/1999 | Krause et al. | |
| 6,002,703 A * | 12/1999 | Hwu et al. | 372/92 |
| 6,151,342 A | 11/2000 | Nightingale et al. | |
| 6,229,831 B1 * | 5/2001 | Nightingale et al. | 372/36 |
| 6,240,116 B1 | 5/2001 | Lang et al. | |
| 6,312,166 B1 | 11/2001 | Zediker et al. | |
| 6,356,577 B1 | 3/2002 | Miller | |
| 6,377,410 B1 * | 4/2002 | Wang et al. | 359/837 |
| 6,396,857 B1 * | 5/2002 | Labranche et al. | 372/36 |
| 6,762,786 B2 * | 7/2004 | Moulin | 347/241 |
| 2002/0171941 A1 * | 11/2002 | Okada | 359/641 |
| 2004/0067016 A1 * | 4/2004 | Anikitchev et al. | 385/34 |

FOREIGN PATENT DOCUMENTS

| | | |
|---|---|---|
| JP | 05-226765 | 9/1993 |
| JP | 8139412 | 5/1996 |
| JP | 10-293233 | 11/1998 |
| JP | 11-309594 | 11/1999 |
| JP | 2001-044547 | 2/2001 |
| JP | 2001-501777 | 6/2001 |

OTHER PUBLICATIONS

Decision of Refusal issued by Japanese patent office Jun. 15, 2010 in counterpart application 2004-506142.

* cited by examiner

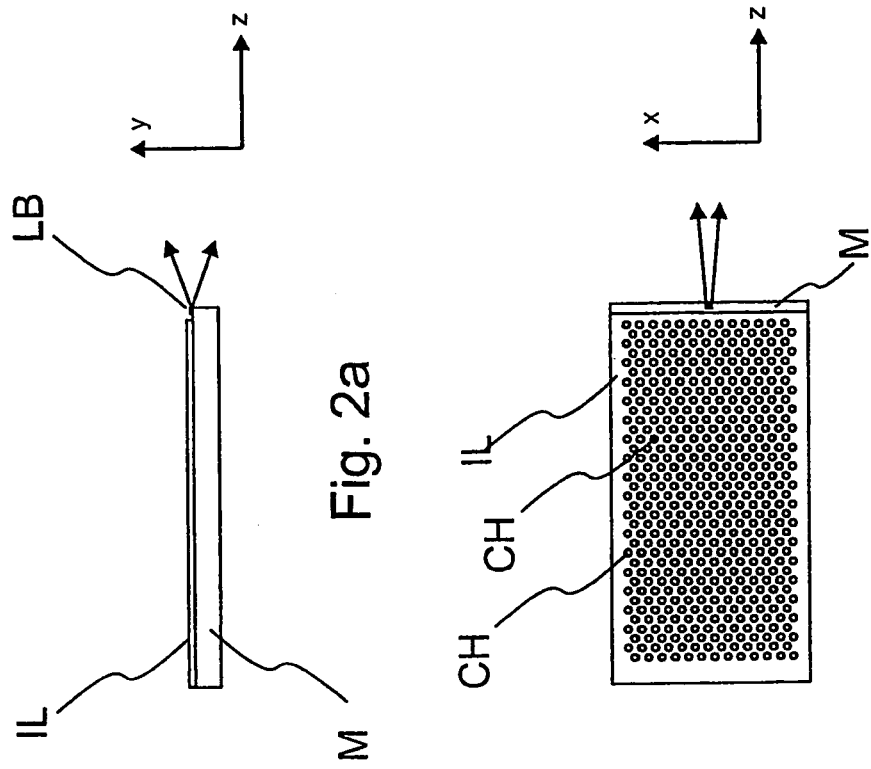
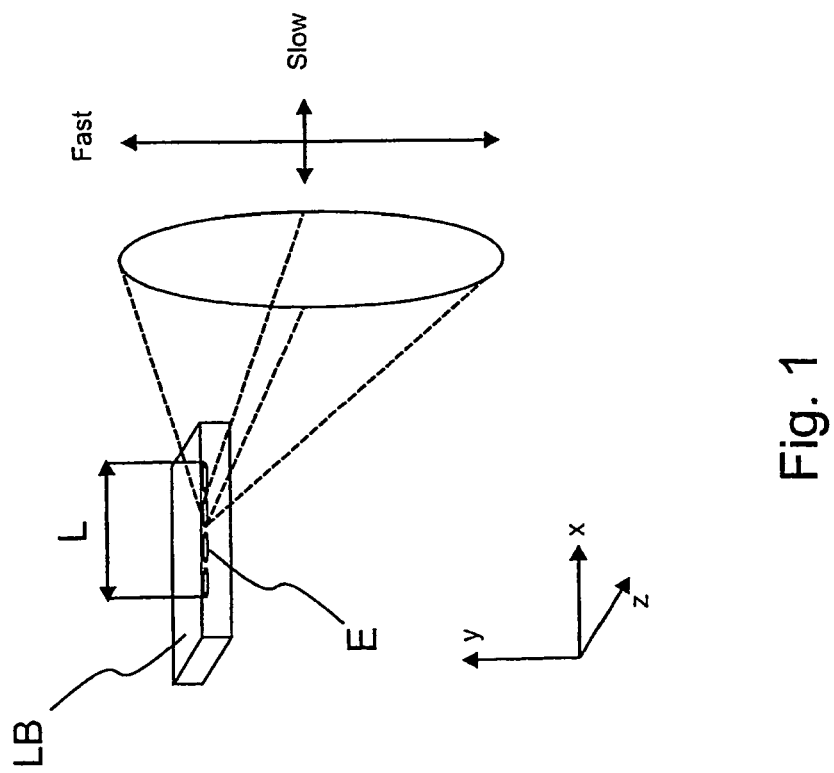

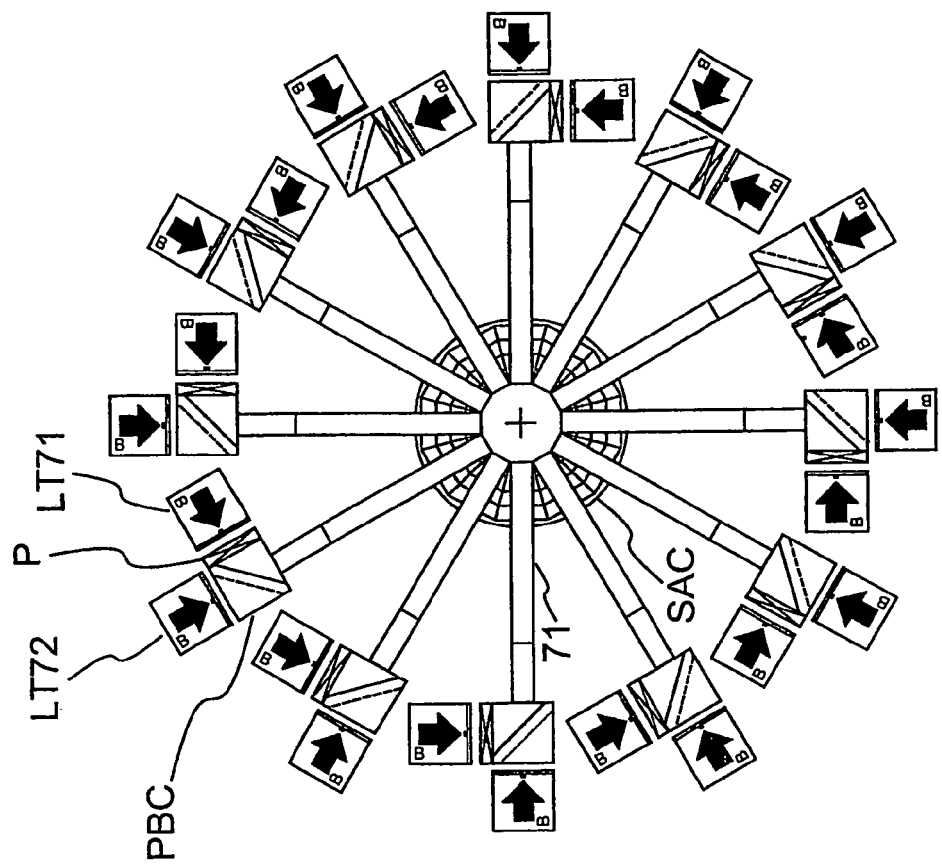
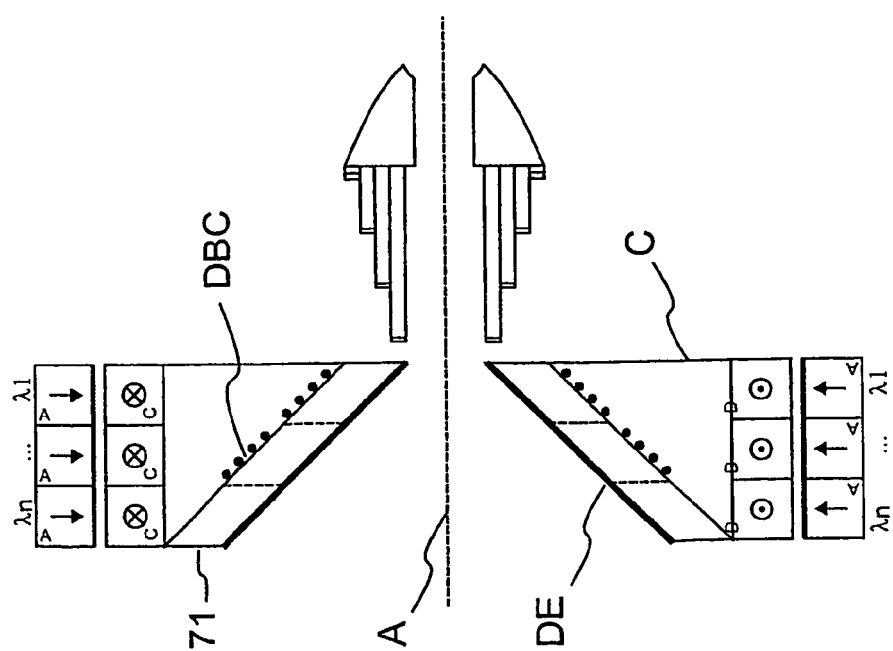
Fig. 7b
Fig. 7a

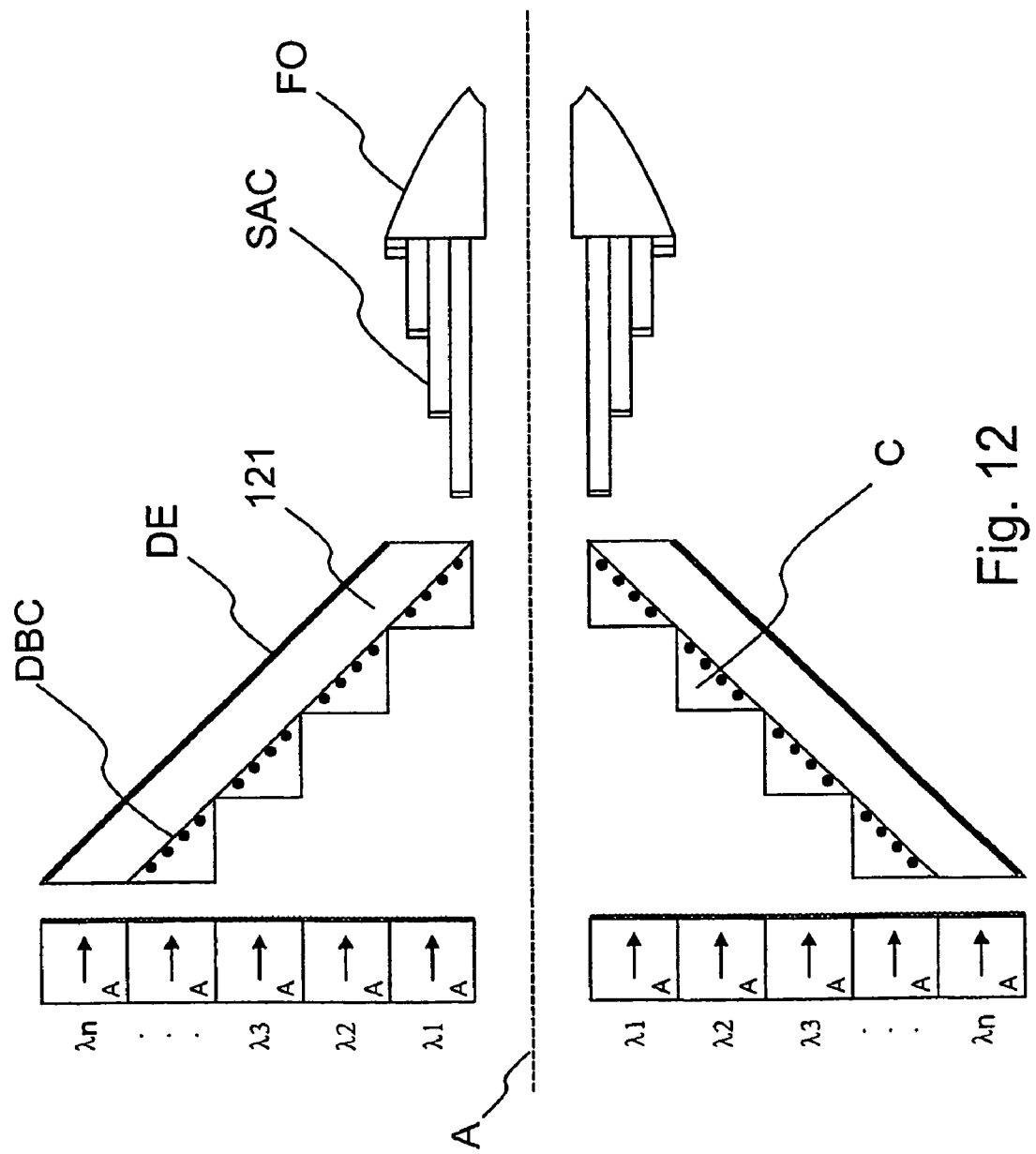

METHOD AND A LASER DEVICE FOR PRODUCING HIGH OPTICAL POWER DENSITY

FIELD OF THE INVENTION

The invention relates to a method for producing a large optical power density. The invention further relates to a laser device implementing the above-mentioned method.

BACKGROUND OF THE INVENTION

Bright light produced by laser devices is today utilized in a multitude of different processes. Such processes include e.g. material marking, surface treatment, cutting and welding. High power lasers are applicable e.g. for handling of metal materials using the above-mentioned processes. Lasers are also widely applied for medical purposes and in various optical measurements.

Since diode lasers based on semiconductors are developing, increasing the optical power obtained thereby and improving the beam quality, applications using compact semiconductor lasers have been strongly expanded for the above-mentioned application areas, which have traditionally been using larger size gas and crystal lasers. Semiconductor laser devices achieve typically a high optical total power by combining radiation emitted by a plurality of single laser emitters.

A generic purpose for a semiconductor laser device with a large power density is to produce a sufficiently powerful and bright beam of light that can be focused to the object in a desired manner. The brightness of the light source is determined as the light power radiated from an emitting surface area to a certain solid angle. The brightness of a single light source cannot be increased by passive optical elements.

As for semiconductor lasers, the light power of a single semiconductor emitter is fairly limited, wherein in order to obtain a sufficient total light power a large number of single emitters are required. To increase the light power, so-called laser bars are used which are composed of a plurality of single emitters arranged side by side, multiple of which laser bars can be further combined one above the other to constitute so-called laser towers. Nevertheless, as the number of the emitters in a light source is thereby increasing, it is inevitable that also the size of the light source increases. In order to increase the power density of the radiation emitted by the light source the beams originating from different locations of the light source should be combined together in a suitable manner. This combining of beams is generally referred to as multiplexing. Different multiplexing methods used in connection with semiconductor lasers include wavelength, polarization and spatial multiplexing.

In wavelength multiplexing the beams of two or a plurality of (n pieces) different wavelengths are combined to constitute one beam that uses beam combiners having suitable wavelength dependencies. Such beam combiners that are well known as such in the field of optics are e.g. dichroic mirrors, known examples of which include e.g. so-called hot/cold mirrors. Upon using beam combiners the diameter of the combined beam can be arranged to correspond substantially to the diameter of each beam to be combined and having a different wavelength. Hence, the power density of the combined beam is increased in a free-of-losses situation to n-fold. Since the solid angle of light can be kept original, also the brightness of the combined beam grows in the same relation as the power density.

In polarization multiplexing two beams having the same wavelength is combined to one beam using a polarization beam combiner. If necessary, the polarization level of the other partial beam can be turned e.g. 90° with a $\lambda/2$-plate. Since the diameter of the combined beam is substantially the same as the diameters of the partial beams that are to be combined, the power density grows in this case practically almost to double. Because the solid angle of light does not change, also the brightness grows almost to the double.

In spatial multiplexing the beams originated from different light sources are collected to the same location in space. The purpose of spatial multiplexing is to maintain the brightness of the original light source as well as possible. The power density can be increased, but since the solid angle of light grows in the same relation, the brightness cannot be increased with mere spatial multiplexing.

In practice it is very difficult to design and implement a structure that would combine a plurality of semiconductor laser beams in an efficient manner and simultaneously use wavelength, polarization and spatial multiplexing. This is due e.g. to the astigmatic quality of the emission of semiconductor lasers, and the width of prior art laser bars.

Typically the height of the light-emitting surface of single emitters used in prior art broad laser bars (later referred to as direction y) is less than 1 μm and in this rapidly diverging direction (fast axle, FA) the beam that originates from the emitter is spreading in a Gaussian manner at an angle of 30 to 40° (FWHM). The light-emitting surface width of individual emitters (later referred to as direction x) is typically of the order 100 μm and in this slowly diverging direction (slow axis, SA) the outgoing beam is diverging at an angle that is less than 10° (FWHM). Inactive, "empty" space that does not emit light is always present between adjacent emitters that have been combined to a laser bar. A laser bar that is typically of the order 10 mm and contains 20 to 40 adjacent emitters produces 20 to 50 W of continuous light power. Proportioned to the length of the laserbar, the light power is then 2 to 5 W/mm. In pulsed use the momentary corresponding power can exceed 10 W/mm.

U.S. Pat. No. 5,825,551 discloses a simple spatial multiplexing method based on two plane mirrors. In the solution, the slow axis of the emitters is directed diagonally between two glass sheets, where the beams of light remain trapped and where they based on reflections travel towards the exit end of the glass sheets. The beams exit from a mirror gap between the glass sheets being narrower than originally. The structure is simple, but a part of the light power is lost as reflection losses. Furthermore, it is difficult to implement different multiplexing methods simultaneously using the referred method, wherein the maximum power density obtained is limited.

Several patents suggest using different types of waveguides for combining beams of laser bars (U.S. Pat. No. 4,820,010) or emitters (U.S. Pat. No. 6,312,166). Solutions based on waveguides remove non-emitted empty space between emitters and/or laser bars and they can be used for transferring light further to optical fibers. However, in practice waveguides often reduce the brightness of the light source in a significant manner. This is due to the fact that a high fill factor cannot be achieved at the exit end of the waveguides. The waveguides must have a sufficiently large light coupling end in order to collect all the light power, but often a part of the coupling surface is inefficient wherein the total brightness deteriorates. In addition, the accuracy of mounting can be a critical factor to the beam quality. Polarization and wavelength multiplexing cannot be directly connected to the use of the waveguides either.

To maintain the laser brightness in the slow axis direction is perhaps the most common problem in combining bright diode laser beams, for which problem solutions are disclosed in a plurality of patent publications. The problem can be solved simply in a manner that emitters are processed on a laser wafer so that they are located sufficiently far away from each other. Thus, in front of individual emitters then slow axis collimation optics with sufficiently large size relative to the size of each emitter (U.S. Pat. No. 5,793,783) can be placed. Nevertheless, such solutions are not advantageous in practice, as the exploitation level of the laser wafer will be poor because most of the wafer is composed of empty space between the emitters.

A plurality of solutions tend to narrow the light field in the direction of the slow axis by using optical methods and at the same time to possibly remove the empty space between the emitters. Generally it can be stated that the narrowing of the slow axis takes place by growing the height of the picture of the light source, which will inevitably involve that the physical distance between the laser bars will grow when combined by piling them one above the other. In addition, the physical space required by the narrowing and piling optics makes the combining of different multiplexing methods difficult. The main characteristics of known narrowing optics will be described in more detail in the following.

In U.S. Pat. No. 5,784,203 the narrowing of the slow axis is carried out using lens optics and parallel deflection utilizing a tower piled of glass sheets. The planes of the glass sheets of the tower are parallel, but the glass sheets have been rotated suitably relative to each other in a manner that the structure resembles a fan. A beam of light coming from a broad laser bar is divided in the direction of the slow axis to partial beams that are deflected in the direction of the fast axis, wherein the light that has originated from different emitters hits different layers in the glass sheet tower. Parallel shifts take place in the glass sheets that have been piled to form a fan structure, wherein beams originating from different emitters are arranged one above another in the direction of the slow axis. The light propagates in the glass sheet tower by means of total reflections, wherein medium of a lower reflection factor than the sheet itself is needed between the sheets and/or the sheet surfaces. Due to the diverging of the slow axis the light intended for different glass sheets is partly mixed and this part is lost. In this method a plurality of cylindrical lenses, ball lenses and glass lenses are needed, which adds to the size of the structure and makes simultaneous utilization of different multiplexing methods difficult. Narrowing and piling can also be done using two towers piled of glass sheets (U.S. Pat. No. 5,805,784 and U.S. Pat. No. 5,986,794). In this solution as well the laser bars remain far from each other and the method is therefore best suitable for fiber based coupling of light power originating from single laser bars.

A multitude of different narrowing and piling structures based on micromirrors have been introduced. For example, two rows of offset mirrors (U.S. Pat. No. 5,887,096) or a deflecting mirror system (U.S. Pat. No. 5,808,323) manufactured of semiconductors by semiconductor technique can be used for the purpose. U.S. Pat. No. 5,592,333 discloses narrowing optics which is based on monolithic mirror technique and which also removes the empty space between the emitters. The beam that has originated from each emitter or emitter group is reflected from both edges of a "V" shaped groove, wherein the direction of propagation changes 90° and the partial beams are piled one upon the other in a new manner. This results in splitting of the original long light beam and the formation of the split partial beams on top of each other in the direction of the fast axis, wherein these beams can be collimated with one lens. The structure of the device according to the method is, however, of "L" shape, which requires a large space. As a result of this, combining the beams of a plurality of laser bars is not very advantageous. Frequently, also problems related to the manufacturing technique of micromirrors are limiting factors. In optics based on mirror reflection, which the solutions above also represent, effect losses caused by absorption take place and the mirrors must possibly be cooled.

Narrowing and compressing the slow axis can be implemented in a manner corresponding to the step mirrors also by using glass bars of a suitable form (U.S. Pat. No. 5,877,898). The entrance surface of each glass bar is perpendicular to the incoming direction of light and the exit surface is 45° relative to the incoming direction of light. Due to the total reflection caused by an oblique exit surface the direction of light changes 90°. Solutions based on the total reflection show only minor power losses. However, small mirror structures integrated of glass bars are difficult to manufacture, and the laser bars cannot be brought close to each other in this solution either.

One practical solution for narrowing and collimating the slow axis is based on deflection prisms (U.S. Pat. No. 5,808,803). The beams of the emitter or emitter group are deflected in the direction of the fast axis by using prisms, wherein these beams that are narrower than the original laser bar can be collimated more accurately with their own cylindrical lenses. The number of the necessary collimation lenses depends on how many parts the original laser bar will be split into. The structure is simple, but the laser bars cannot be brought close to each other, because the deflection must be carried out in the direction of the fast axis. If the object is to collimate 20 emitters of laser bar separately, a 20-piece prism structure would be needed further with a 20-story collimation lens tower. Also the total brightness will be lowered which is unnecessary since the beams leaving from different emitters are not placed on top of each other in the direction of the slow axis.

The empty space between the emitters can be removed also before combining the beams, as has been done in U.S. Pat. No. 6,240,116 based on the step mirror structure.

As a summary of the above-described prior art solutions it can be stated that they tend to resolve the optical problems which are related to controlling the slow axis of the emitters and which are largely caused by properties of presently used broad laser bars. The above-described solutions facilitate the handling of the slow axis at the cost of more complicated structures and increased physical size of the technical solutions, which, in turn, makes the simultaneous usage of different multiplexing methods difficult and thereby limits the brightness and power density.

SUMMARY OF THE INVENTION

The main purpose of the present invention is to introduce a novel overall solution to the situation, in which a high optical power density is produced by combining together radiation emitted by several semiconductor lasers.

The method and laser device introduced in the present application are primarily based first on the use of so-called narrow laser bars that are shorter in the direction of slow axis than those of the prior art, and secondly on the utilization of a special axial symmetrical structure upon collecting together radiation of laser bars arranged to different sectors.

The narrower than conventional structure of the laser bars according to the present invention provides a simplified or more effective cooling compared to the broad laser bars in prior art. The fact that the laser bars are narrow also involves that it is possible to avoid the prior art cumbersome and limiting narrowing optics of the light beam in the direction of the slow axis. This, in turn, enables very compact axial symmetrical structural solutions, which enable utilization of spatial, wavelength and polarization multiplexing efficiently at the same time.

Hence, the solution of the invention enables increasing the power density of the radiation composed of different laser bars closer towards the theoretical maximum that would be obtained in an ideal situation in which the optical efficiency of different emitters could be combined without losses and directed to a desired point. Therefore, the solution of the invention makes it possible to achieve power densities that are higher than those of prior art, as well as a better combined beam quality.

The method and device of the invention show a plurality of other advantageous properties, which become evident to an expert in the field from the detailed description of the invention that will be presented in the following.

To implement the above-mentioned purposes, the present invention includes a method and laser device as described herein.

BRIEF DESCRIPTION OF THE DRAWINGS

In the following, the invention will be described with reference to the appended drawings, in which FIG. 1 shows xyz coordinates used in the figures and description in connection with a narrow laser bar of the invention, FIG. 2a shows in a principle manner, as seen from the direction of the x-axis, a narrow laser bar attached on a cooled base plate, FIG. 2b shows the unity of FIG. 2a as seen from the direction of the y axis.

FIG. 7a shows, in a principle manner, a third embodiment of the invention from the side, FIG. 7b shows, in a principle manner, a third embodiment of the invention from behind, FIG. 12 shows, in a principle manner, a sixth embodiment of the invention.

DETAILED DESCRIPTION OF THE INVENTION

In accordance with FIG. 1 it is first determined that the direction y is the direction of the fast axis in the coordinates of the narrow laser bar LB composed of semiconductor emitters E arranged side by side, and direction x is the direction of the slow axis. All the light beams that leave from the laser bar LB first propagate substantially to the same direction z. In the laser bar LB the slow axes x of the adjacent emitters E are positioned to the same line relative each other and said diode lasers E emit substantially to the same direction z.

The narrow laser bar LB of the invention relates to a structure, in which emitters E have been arranged to a laser bar side by side in the direction x to a substantially narrower area L (the width of the near field) than in prior art laser bars. Typically only for example 5 pieces of emitters E are located side by side in the narrow laser bar LB, when in the prior art laser bars their number is typically 20 to 40 pieces. A single semiconductor emitter E is later referred to also as a semiconductor laser or diode laser.

In an axial symmetrical structure of the invention the basic parts made of narrow laser bars LB, the basic parts being e.g. laser towers and/or laser tower piles formed of laser bars that are piled one upon the other, as well as the possible optics is positioned in sectors to form a circle in which the structure of the sectors repeats itself in regular or irregular angle spacings.

A laser device having a large power density and based on narrow laser bars LB is next examined by following the propagation path of light in the order: narrow laser bar—installing the laser bar on a base plate—piling the laser bars—collimating the fast axis (FAC)—combining the beams—collimating the slow axis (SAC)—focusing—the final result.

Figure 5:
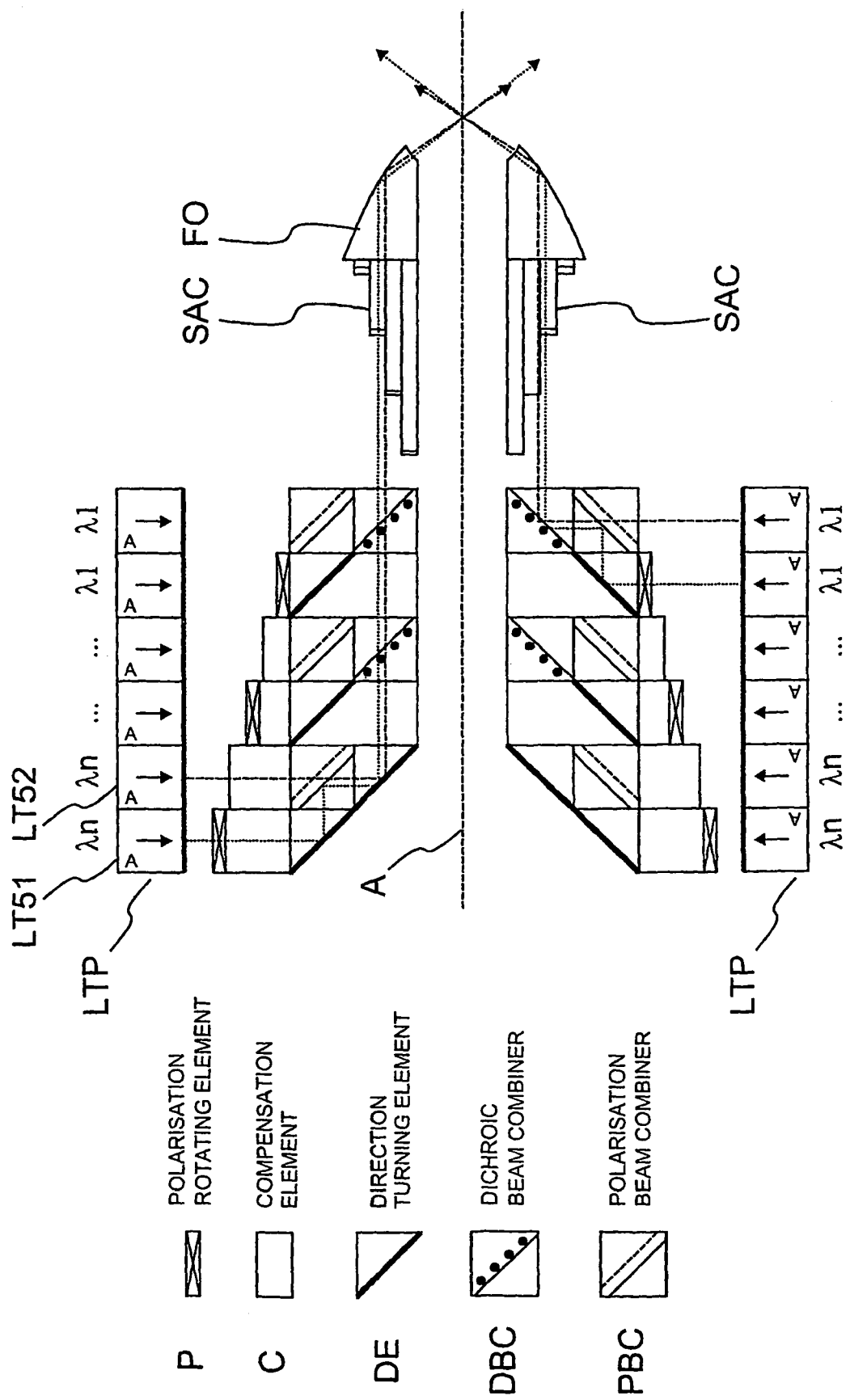
FIG. 5 shows, in a principle manner, one basic embodiment of the invention, as well as drawing marks used later in the figures.

In view of the central principles of the invention the description relates in the following mainly to the basic principle of the invention as illustrated in FIG. 5. Some other possible embodiments of the invention are also observed in more detail hereafter.

1. Properties and Manufacture of a Narrow Laser Bar

In accordance with FIG. 1, the basic starting point of the invention is a single narrow laser bar LB, which refers to a single component processed of a laser wafer and containing one or a plurality of laser emitters E. Said laser emitters E form together a near field L, which is parallel with the slow axis of said component, the near field being substantially that narrow that the beam transmitted by the laser bar LB can be directly collimated and focused with an accuracy that is sufficient for the purpose of use, wherein special narrowing optics of prior art are not required.

The narrowness of the laser bar LB can be brought about either by using a smaller total number of parallel emitters E in the same laser bar and/or by spacing the emitters E more densely than in prior art laser bars.

The width L of the near field parallel with the slow axis of a narrow laser bar LB can be preferably of the order 0.5 mm. In the laser bars LB the emitters E are electrically parallelly coupled.

The emitters E of the narrow laser bar LB can show a structure of the prior art or they may be better optimized for this purpose. The emitters E can therefore be spaced side by side more densely than in the established practice, wherein the total brightness of the laser bar LB grows thanks to a larger optical power obtained from the same area. A more dense spacing of the emitters E compared to the conventional spacing becomes possible in narrow laser bars LB thanks to the cooling properties of the laser bars that are better than the cooling properties of prior art. This is due, among other things, to the fact that in narrow laser bars LB heat can be directed away from the centrally positioned emitters E partially also in the direction x. Since narrow laser bars LB contain typically remarkably fewer numbers of emitters than broader laser bars, the total amount of thermal power produced therein is lower, which reduces the requirements directed to cooling as such.

It can be estimated that the processing methods of semiconductors that are used at present enable producing narrow laser bars LB with 0.5 mm width, each giving light power of the order 10 W. Proportioned to the length of the laser bar LB this corresponds to 20 W/mm, which is considerably more than prior art broad laser bars. This distinction is primarily caused by the fact that emitters E can be spaced more densely than in conventional solutions thanks to the above-mentioned better cooling properties of the narrow laser bar LB.

As the density of the emitters E is growing, a laser wafer can be grown and processed in the manufacturing phase of the lasers in a manner that more light power is obtained per area unit compared to the present situation. This will, in its part, lower the manufacturing costs of the laser.

2. Installing a Narrow Laser Bar on a Base and Cooling the Laser Bar

A narrow laser bar LB is installed in accordance with FIG. 2 on a base plate M in order to make the cooling more effective in a manner that the lasing semiconductor layers of the laser bar LB structure are as close as possible to the cooled base plate M. The fixing method used can be, which is known as such, e.g. different glues, solders, evaporating solders and/or combinations thereof, which have good electrical and thermal conductivity.

In practice, the laser bars LB that are emitting from the side to the direction z are attached to the base plate M typically p-side downwards. The size of the base plate M is preferably both longer and broader than the narrow laser bar LB, and the material of the base plate M is selected so as to have a possibly good thermal conductivity. Between the laser bar LB and the base plate M can be arranged a layer that transfers heat effectively, a so-called "heat spreader" (not shown in the figures), which can, if necessary, operate also as an electrical insulator (e.g. a polymorphic diamond coating or boron nitride) A sufficient number of channels CH for cooling are machined to certain places of the base plates, wherein cooling liquid or other cooling medium is flowing through said channels. Another alternative is to machine the channels CH only to ready-made laser towers formed of laser bars LB by piling.

A narrow laser bar LB according to the invention becomes heated about one tenth compared to presently used broad laser bars, which decreases to a significant degree the requirements set to cooling.

Thanks to the small physical dimensions of the narrow laser bars, in connection with their cooling, it is easier to use, instead of broad laser bars, efficient "heat spreader" bases, wherein the different limiting problems caused by thermal expansion are avoided. In addition, the laser bars LB bend remarkably less relative to the axis of direction x (so-called "smiling") than the broad laser bars of prior art. Large size diamond foils ("heat spreaders") needed in the heat transmission are difficult to manufacture with the prior art techniques.

Furthermore, the cooling of a narrow laser bar LB is more efficient with a narrow structure compared to a broader structure, because the heat flux can spread to the base also in direction x and the cooling base plate M can be significantly broader than the laser bar LB in this direction.

Instead of the cooling, which is shown in principle in FIGS. 2a and 2b and is based on "microscopic" channels CH it is possible to use also a so-called micro channel cooling known very well from the prior art as such. In micro channel cooling the aim is to bring the cooling agent in the small machined micro channels of the base plate M as close to the heat generating laser emitters as possible. An advantage in using the narrow laser bars LB is, however, that it is possible to implement a sufficiently efficient cooling in most cases using more simple structures and entirely without expensive micro channel cooling which is, as known as such, difficult to implement.

Figure 3:
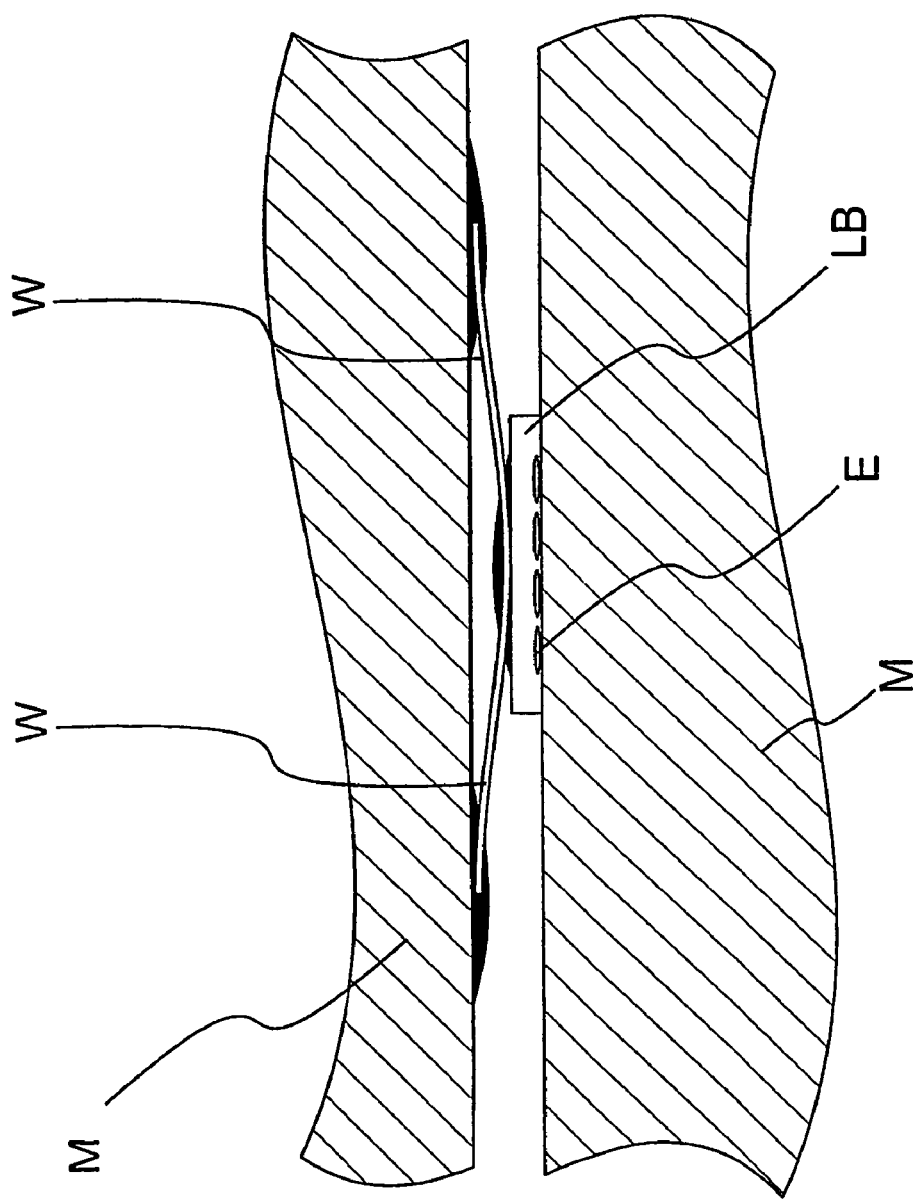
FIG. 3 shows, in a principle manner, as seen from the direction of the z axis, one wiring arrangement of a laser bar situated between two base plates that are positioned one upon the other, FIG. 4a describes, in a principle manner, as seen from the direction of the x-axis (from the side), a laser tower composed of narrow laser bars.

A structure of a cooled laser bar LB can be as follows. A thin insulating plate IL has been attached on the base plate M (e.g. of copper), the insulating plate being, as shown in FIG. 2a, short relative to the base plate M at the end of the laser bar LB, wherein the laser bar LB can be installed directly against the surface of the base plate M. Said insulating plate IL coming between the two base plates M that have been piled on top of each other can be e.g. of boron nitride or some other material with high thermal conductivity. The laser bar LB is attached to the base plate M with the p-side downwards. The laser bar LB may comprise a ready-fitted current conductor W, as shown in FIG. 3, which can, after the laser bar LB has been attached to the base plate M, be connected to the bottom of the base plate M of the next layer, e.g. using an electrically conductive silver compounding epoxy glue. The current conductor W can be arranged e.g. as shown in FIG. 3, wherein the both free ends of the conductor W are attached to the bottom of the above base plate M. In an alternative manner, only the other end of the conductor W can be attached to the above base plate M.

When installing the laser bar LB to the base plate M it is possible to use also mere soldering or gluing technique instead of the current conductor W. The installation can also be carried out in a manner that the laser bars LB attached to the base plate M are ground down to the same level with the insulating plate IL. Subsequently, it is possible to attach to the surface e.g. a soldering preform, evaporate a suitable soldering layer or apportioning an electrically conductive glue layer. The base plates M that are piled on top of each other can also be heated at once, wherein the solder layer melts and the necessary contact is brought about between the base plates M that are on top of each other and the laser bar LB that is on the base plate.

3. The Piling of Laser Bars to Laser Towers and to Laser Tower Piles

To bring about a larger light power the single laser bars LB that are attached on the base plate M are piled to form higher laser towers, in which the laser bars LB are electrically coupled together in series. In connection with the piling, the end surface of the laser bars LB at the emitters E side can be protected temporarily, wherein the air gaps that possibly remain in the structure can be filled preferably by a thermally conductive material, e.g. by a suitable electrically conducting glue. In this case the cooling of the structure becomes more efficient.

Figure 4:
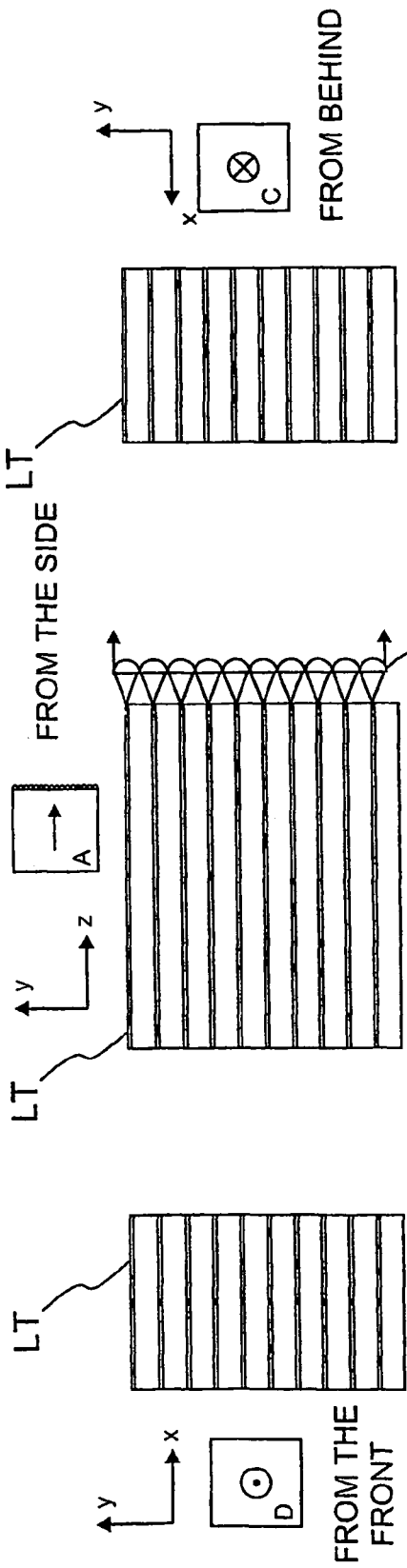
FIG. 4b shows the laser tower of FIG. 4a as seen from the direction of the y axis (from above)
FIG. 4c shows the laser tower of FIG. 4a from the direction of the z axis and against the direction of light (from the front)
FIG. 4d shows the laser tower of FIG. 4a from the direction of the z axis and along the direction of light (from behind)

FIGS. 4a to 4d show, in a principle manner, one possible laser tower structure LT built of narrow laser bars LB, as well as collimation optics FAC of the fast axis (not shown in FIGS. 4c and 4d). The collimation optics FAC can be a prior art lens set, which in accordance with FIG. 4a is composed of lenses that have been arranged separately in front of each laser bar LB.

FIGS. 4a to 4d show also drawing marks corresponding to different directions of said laser tower LT that is collimated relative to the fast axis. These drawing marks are utilized in the following figures.

When laser bars LB are piled on top of each other to form a laser tower LT, the size of the area of structure that emits light increases in the direction of the fast axis and remains the same in the direction of the slow axis. Ready made laser towers LT can be further piled in a corresponding manner on top of each other, wherein piles of laser towers LTP are obtained in which the size of the light emitting area is further growing in the direction of the fast axis. The piles of laser towers LTP can include laser towers LT of different wavelengths, as will be shown later e.g. in FIG. 5.

The piles of towers LTP can be piled in a manner that the laser towers LT are directed on top of each other at a sufficient accuracy, so that the laser towers LT contained in the laser tower pile LTP can be connected to be cooled in a series. In other words, the cooling channels CH contained in the laser bars LB are directed to each other in the laser bars LB that are positioned on top of each other and the cooling channels CH travel therefore in uniform through the entire laser tower LT and further the laser tower pile LTP.

The cooled base plate M can be coated e.g. using an alternating Sn/Au solder layer structure, in which the melting temperature of the coating typically rises when the structure has been melted for the first time. This enables piling of cooled laser towers LT one cooled laser bar LB at the time without having the previous solder joint melt in connection with soldering of a new cooled laser bar LB. The thickness of the Sn/Au solder layer structure manufactured by evaporating is also known accurately, wherein the dimensions of the laser towers LT are known at a high accuracy.

One laser tower LT containing e.g. 10 narrow, cooled laser bars LB can give typically 100 W of continuous light power. The out coming light has been polarized with edge emitting bright diode lasers usually in the xz plane.

4. The Collimation of the Fast Axis (FAC)

The fast axis of each laser bar LB is collimated in a typical manner known from the prior art as such by using the fast axis collimation optics FAC as soon as the beam has spread in this direction almost to cover the distance between the overlapping laser bars LB. The collimation can be implemented e.g. using aspherical cylindrical lenses, grin lenses, diffractive optics or combinations of these. FIG. 4a shows, in a principle view, a lens set FAC implementing the collimation of the fast axis.

In a situation, in which the single laser bars LB in the laser towers LT are positioned at a sufficient accuracy relative to each other, it is preferable to use for collimation of the fast axis one optical matrix element, the lens set FAC, which is positioned as a single component in front of the laser tower LT. Thus, the number of the FAC components to be installed reduces significantly and the step is fast to implement. When using narrow laser bars LB according to the invention such a FAC component is also small in size, which makes the automatization of the installation easier.

One generally limiting factor in the collimation of the fast axis of the diode lasers is the inaccuracy of the distance in the z direction between the emitter E and the collimation optics FAC. In other words, the distance between a single emitter E and a place of the collimation optics FAC corresponding thereto is not sufficiently accurate for proper collimation of the beam. In case of broad laser bars of the prior art the inaccuracy of the above-mentioned installing becomes efficiently multiplied and the collimation optics FAC can e.g. in the edges of a broad laser bar in the direction x deviate from the optimum distance to a harmful degree.

Moreover, in connection with the installation of broad laser bars e.g. monitoring carried out using a microscope is cumbersome, because when using a sufficient magnification the edges of the broad laser bar are too far away from each other in the direction x for obtaining an accurate image in one go using an imaging device. The narrow laser bars LB of the invention are not as sensitive to the inaccuracy of positioning as prior art broader laser bars. Both edges of the narrow laser bar LB can be easily monitored in one go at a high accuracy e.g. by means of computer vision using only one imaging device.

5. Combining Beams (Multiplexing) and Compensation

FIG. 5 shows, in a principle view, laser towers LT, and laser tower piles LTP that are formed by piling the laser towers on top of each other positioned in a circular formation of the invention in sectors in a manner that all transmit light to a radial direction towards an axis of revolution. The axis of revolution A is referred later to as the optical axis A.

Any physically possible number of laser tower piles LTP can be applied in sectors in said circle. In accordance with the invention, the direction of beams originating from each laser tower pile LTP is turned 90° using suitable optical elements, wherein all beams can be made to propagate axially to the same direction at a certain distance from the optical axis A. These beams propagating to the same direction are focused further to one point in order to produce a high optical power density.

In the following, propagation of beams originating from different laser towers LT are observed on a structure according to FIG. 5. The principles and drawing symbols shown in FIG. 5 are utilized later in the other embodiments of the invention shown in FIGS. 6 to 13.

The beam of the wavelength $\lambda n$ is first examined, which originates from the laser tower LT51 of FIG. 5. Said beam which has been schematically shown with a dotted line is first propagating radially straight towards the optical axis A proceeding through a polarization rotating element P and an optical compensation element C, until the beam is deflected from its original direction of propagation 90° by means of a direction turning element DE.

The purpose of the optical compensation elements C is to modify the beam that is combined of the laser towers LT included in a single laser tower pile LTP to be such that the slow axis of the beam that is combined of the emitters of said laser tower pile LTP by multiplexing can be collimated by the collimation optics SAC of the slow axis as will be described later.

The compensation element C is typically an optical plane produced of optical material having a suitable index of refraction and compensating the path difference of the beams; a piece of medium. By adapting the index of refraction of the material as well as the thickness and form of the piece in a suitable manner for each laser tower LT, it is possible to compensate the different distance of the laser towers LT relative to the focusing optics FO.

The compensation element C can operate also as a lens, wherein also the different dispersion of the different wavelengths $\lambda 1$ to $\lambda n$ of the laser towers LT and/or their different initial divergences are considered. Hence, the compensation element C can be or include e.g. one or a plurality of cylindrical lenses.

Compensation can be implemented also entirely without actual compensation elements C, e.g. in a manner that the distance of each laser tower LT from the optical axis A is set applicable when forming a laser tower pile LTP.

After the turning element DE, which can be e.g. a mirror or a prism, the beam originated from the laser tower LT51 continues axially to a polarisation beam combiner PBC in which the polarization multiplexing of the beams that have originated from the laser towers LT51 and LT52 takes place.

The operation of the polarization beam combiners corresponds in principle that of the polarization beam dividers, but is reversed relative to that of the beam dividers. Since the beams combined with the polarization beam combiners PBC must preferably be perpendicularly polarized relative to each other, it is possible to rotate the polarization of a second beam to be combined by 90° by polarization rotating elements P, such as λ/2 plates, if necessary. The light originating from the laser towers LT is originally polarized in the xz plane.

A beam illustrated by a dotted line and originating from a laser tower LT52 proceeds to the polarization beam combiner PBC and proceeds without changing its direction through said component. A beam coming from the laser tower LT51 has, in its turn, propagated earlier through the polarization rotating element P, in which its polarization plane has rotated 90°. In the polarization beam combiner PBC this polarization plane faces a 90° change. After the polarization beam combiner PBC the beams proceed as overlapping.

Subsequently the combined beam proceeds towards the optical axis A, until it is deflected to proceed axially by means of the direction-turning element DE.

Wavelength multiplexing is implemented using suitable dichroic reflectors and ordinary mirrors and/or prisms. Wavelength multiplexing makes it possible to combine the beams of the laser tower LT of each laser tower pile LTP emitting different wavelengths λ1 to λn to one beam.

The dichroic beam combiners DBC encountered by the beam of the polarization multiplexed λn wavelength during its progress have been designed in a manner that the wavelength λn in question proceeds through them without changing the direction. Each dichroic beam combiner DBC is also designed to deflect the beams coming radially from a respective axial location to be parallel with the direction A of the optical axis A, but to pass the beams coming from the left in FIG. 5 which are thus already parallel with the optical axis A. Hence, the multiple different wavelengths λ1 to λn originating from different laser towers LT of the laser tower pile LTP can be connected on top of each other.

Laser towers LT and laser tower piles LTP that are piled of narrow laser bars LB as well as the axial symmetric structure of the invention enable, as described above, a very effective spatial multiplexing. The spatial multiplexing is applicable for collecting the beams of each laser tower pile LTP that are located in different sectors and combined by wavelength and polarization multiplexing to the same location in space. If the structure according to FIG. 5 contains m sectors, i.e., m items laser tower piles LTP (m=2, 3, . . . ) in an axial symmetric formation as seen from the direction of the optical axis A, it is possible to increase the power density of the focus point when no loss is present to m-fold.

Due to the axial symmetrical structure of the invention the outer periphery of the device has a lot of room for arranging the cooling of the laser bars LB.

6. The Collimation of the Slow Axis (SAC)

In the solution of the invention the narrowness of the laser bars LB makes the collimation of the slow axis simpler to a significant degree, because complex and room consuming prior art narrowing optics and piling optics are totally avoided. In accordance with the invention, the slow axis is collimated preferably after combining beams originating from different laser towers LT and laser tower piles LTP, when said beams that are parallel with the optical axis A and diverge slowly in the direction of the tangents of the circles surrounding the axis have grown to an adequate cross-sectional area. The cross-sectional area of the beams enable the use of large collimation components, which enables the precision of the collimation, which is a very well known principle from the optics as such.

The collimation of the slow axis can be implemented in accordance with the invention by the collimation optics SAC of the slow axis shown in FIG. 5. Said collimation optics SAC is preferably a stepped lens pile, the cross-section of which lens pile as seen from the direction of the optical axis A resembles the area of a corresponding circle sector. One structure of the slow axis collimation optics SAC based on the lens pile is illustrated in more detail in FIGS. 8*a* to 8*c*.

Figure 8C:
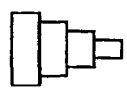
FIG. 8c illustrates the structure of FIG. 8a as seen from the direction of the z axis (optical axis)
Figure 8A:
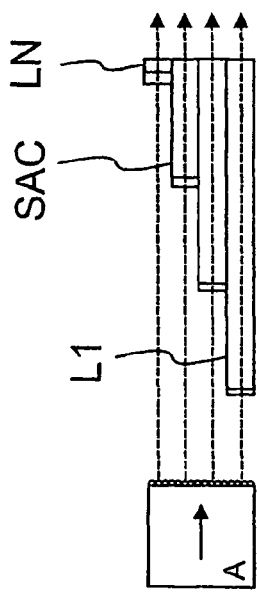
FIG. 8a illustrates one structure of the collimation optics of the slow axis as seen from the direction of the slow axis.
Figure 8B:
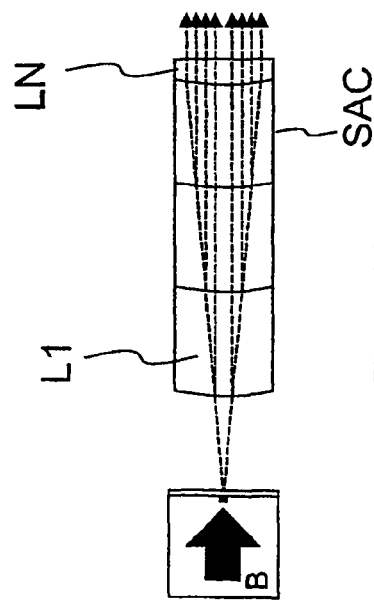
FIG. 8b illustrates the structure of FIG. 8a as seen from the direction of the fast axis.

The beams that have originated from the laser towers LT and collimated directly thereafter by the collimation optics FAC of the fast axis relative their fast axis are directed at different planes L1 to LN of the collimation optics SAC (lens pile) of the slow axis according to FIGS. 8*a* to 8*c*. The distance of each single plane L1 to LN of the collimation optics SAC from the lasers contained in the laser towers LT is determined by the fact that the beam diverging in the direction of the slow axis has time to grow substantially to the width of the lens that is positioned in its place (plane L1 to LN). In practise practice this means that the light is collimated always using as large lens as possible and, in accordance with the basic principles of the optics, the quality of the collimation can thereby be preserved as high as possible.

7. Focusing

A light field combined together by wavelength, polarization and spatial multiplexing and collimated relative to the fast and slow axes can now be focused further using an applicable reflection or lens optics as focusing optics FO.

When using an axially symmetric paraboloid mirror as focusing optics FO, as shown in FIG. 5, achromatic errors can be avoided, wherein different wavelengths are focused similarly and it is possible to produce a small circular focus point. Very large numerical aperture values of the focused beam can be produced by means of paraboloidic mirror optics, wherein large power densities and short-scope focus depths are obtained.

Figure 11:
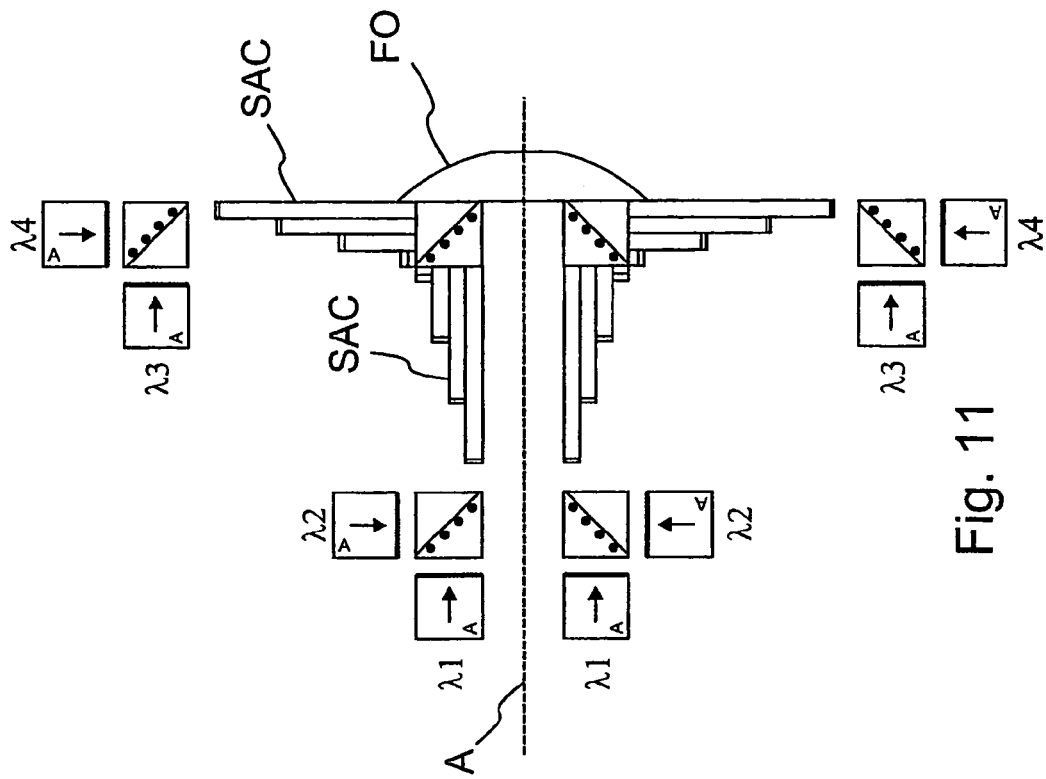
FIG. 11 shows, in a principle manner, a fifth embodiment of the invention.
Figure 10:
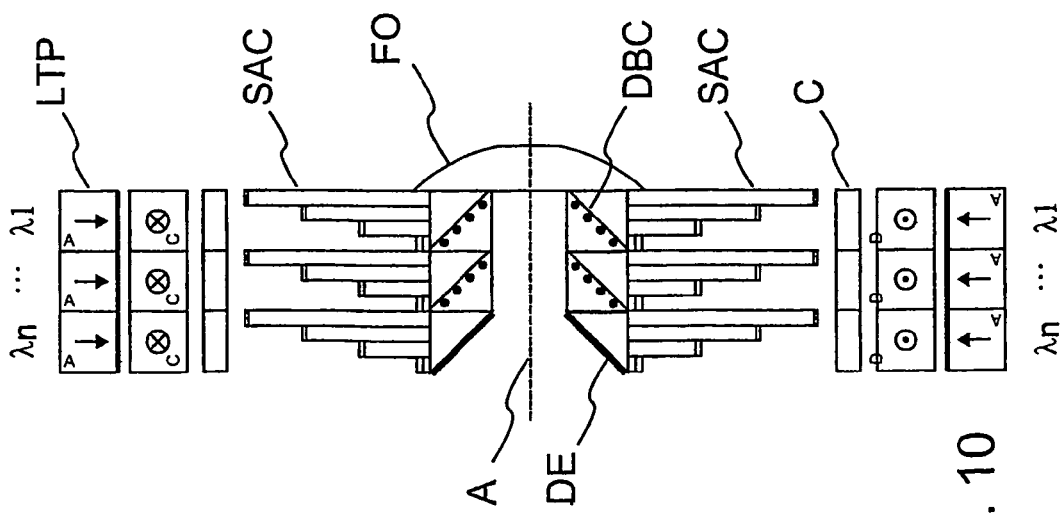
FIG. 10 shows, in a principle manner, a fourth embodiment of the invention.

When using lens optics as the focusing optics FO, such as in the embodiments shown in FIGS. 10 and 11, the achromatic errors make the focus point more oblong in the direction of the optical axis A when a plurality of wavelengths are focused. This can be a desirable feature in some situations. Thus, an optimal focusing optics can be selected depending on the application.

Figure 9A:
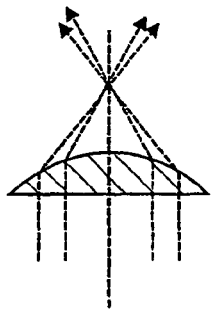
FIGS. 9a-9e show, in a principle manner, different types of focusing optics.
Figure 9B:
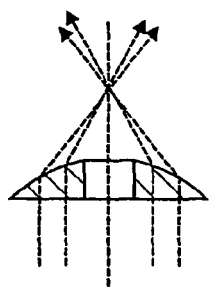
Figure 9C:
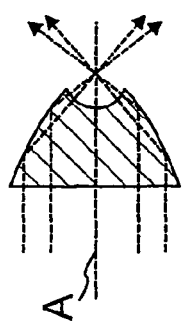
Figure 9D:
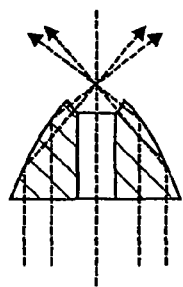
Figure 9E:
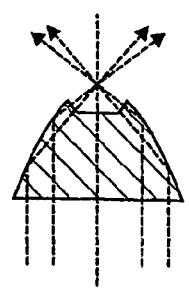

Some focusing optics FO that are applicable for focusing the light power are shown in FIGS. 9*a* to 9*e*. FIGS. 9*a* and 9*b* show optics that are based on lens optics and FIGS. 9*c* and 9*e* show respectively solutions based on mirror optics. Depending on the purpose of use of the device the optical axis A can be penetrated in the middle of the focusing element FO (FIGS. 9*b* and 9*d*). To the paraboloidic focusing mirror it is possible to treat a spherical surface in the centre of a focal point, through which the wave front follows in parallel with the normal direction of the spherical surface and thus without distortion (FIGS. 9*c* to 9*e*). The part of the rotation axis in the vicinity of the spherical surface, through which part no beams proceed, can be punctured or formed to a planar surface (FIGS. 9*d* and 9*e*). The planar surface can brought about e.g. using filling material which has a suitable optical density and which can be added to the compound FO e.g. by gluing gluing or casting. The focal distance of the paraboloid can be selected to best fit the application.

8. Result

By means of the narrow laser bars LB and the axial symmetrical sectored structure of the invention it is possible to implement very compact technical solutions in which different multiplexing methods can be utilized efficiently and simultaneously. By using an efficient wavelength and polarization multiplexing it is possible to bring about a beam whose brightness is higher than the original brightness of a single diode laser. Due to the method it is possible to bring about power densities, which are sufficient for processing of different materials.

Due to the axial symmetrical structure the focus point of the laser device according to the invention is circular, which is advantageous e.g. in view of automation of the use of the laser device. In addition the structure enables the use of the free space that remains in the vicinity of the optical axis A, e.g. for visualization, supply of different materials, suction or blowing. Due to the compact structure there is no need to transfer the beams for long ranges, wherein minor inaccuracies in the mutual positioning of the components of the laser device do not impair the beam quality as much as in structures that are larger in size. The narrow laser bar LB is advantageous also in view of cooling.

The narrow laser towers LT also enable supplying a certain electrical power into the laser device also with a higher voltage and lower total power compared to the broad laser towers used at present. This is a particularly important feature in different pulse applications in which the times of rise and fall of current pulses and correspondingly also of light pulses are critical. For example in medical applications the optical energy can be rationed in a more accurate manner to the target. Thanks to its good wavelength multiplexing properties the device of the invention can be used e.g. in a manner that different wavelengths $\lambda 1$ to $\lambda n$ are optimized for carrying out different processes. One application of this kind could include cutting a tissue with one wavelength and coagulating blood with another wavelength. A third wavelength could be for illuminating a target, wherein the visualization of the target would occur with a different wavelength than processing the target. Thus it is easy to filter off the wavelengths used in processing and to bring forth the morphology of the target.

SOME PREFERRED EMBODIMENTS OF THE INVENTION

The solution based on the narrow laser bar LB and axial symmetrical sectored structure of the invention can be implemented technically in many ways. In the following some preferred embodiments of the invention are described. At first we consider some issues that are generally varied in structures. Thereafter we still consider some special embodiments.

Variations of a General Embodiment

When manufacturing the diode lasers it is possible to produce the laser wafer of semiconductor material to a thinner form than usual, wherein the laser bars LB that are thinner than normal are obtained correspondingly. This will make the cooling more efficient, because the thermal energy is then transferred more efficiently through the thin semiconductor layer of the laser bar LB to the cooled base plate M.

The channeling CH of the base plates M of the laser bars LB can be performed in a plurality of different manners. The base plates M can contain a large number of small holes, and on top and under a pile composed of multiple base plates M there can be elements collecting together the channels CH in the end of said pile for attaching external cooling tubes. If the cooling channels are made exactly at the same place in each laser tower LT of the laser tower pile LTP, it is possible to combine the channels CH by attaching the laser towers LT closely together. The cooling channels CH formed in the base plates M can also be grooves. It is also possible to use prior art microchannels in the cooling of laser bars LB.

The laser tower LT can be implemented in several different manners. The laser tower LT can be constructed e.g. to be step-like in a manner that the light-emitting front walls of the laser bars LB that are situated on top of each other are located in a plurality of different levels. Such step-like laser tower structure can be utilized in compensation because different laser bars LB are located at different distances from each other, and relative to the optical components (e.g. DE, DBC, PBC, SAC, FO) that treat the beam and relative to the optical axis A.

The dichroic beam combiners DBC used in the wavelength multiplexing, such as dichroic mirrors can have different forms. The structure of FIG. 6 comprises dichroic beam combiners DBC having a diamond shaped cross section compared to the square shaped elements used in FIG. 5. The square shaped dichroic beam combiners DBC can be formed e.g. by attaching two prisms of 90° that have a triangular cross section when looked from the side in a manner that e.g. the other surface to be attached is a dichroic mirror (coating). Also polarisation multiplexing can be implemented using different polarisation beam combiners PBC whose structure and use is known as such to an expert in the field.

The slow axis can be collimated in a manner described above after combining beams obtained from different laser towers LT and after they have been turned parallel with the optical axis A. In an alternative manner the collimation of the slow axis (SAC) can be carried out directly after the collimation has been carried out to the fast axis FAC.

FIG. 10 describes a structure in which the collimation of the slow axis is carried out to each of the laser towers LT with a separate collimation optics of the slow axis SAC (lens surface) before turning the direction of the beams. In this case more collimation optics of the slow axis SAC are required, but on the other hand the compensation of the beams can be carried out more accurately.

The collimation of the slow axis of the laser tower LT or the laser tower pile LTP that is carried out directly after the fast axis can be implemented by a lens pile that is composed of one or a plurality of lenses and steps. In case there is only one step L1 to LN (cf. FIGS. 8a to 8c), that is an ordinary cylindrical lens, then the collimation takes place homogenously to every laser bar of the laser tower LT. If there are more steps L1 to LN, the partial beams that have left from the different parts of the laser tower LT travel unequal path distances before collimation. Due to the diverging those partial beams that have traveled a longer distance before the collimation reach the collimation optics SAC in a larger size than the partial beams that have traveled a shorter distance before the collimation. Using this principle it is possible to increase the beam size when travelling away from the optical axis A, and to utilize, as efficiently as possible, the disposable area of the axial symmetrical structure that is growing along with the beam. Hence, also the quality of collimation improves respectively. The step structure can be omitted from the collimation optics of the slow axis, if the path differences of the partial beams are formed in some other manner, such as the earlier mentioned laser tower LT with a step-like structure, or if the quality of the beams is otherwise sufficient.

Improvement in the manufacturing technique of diode lasers may in the future lead to a shorter divergence of the slow axis (e.g. so-called tapered lasers), wherein the quality of beam can be further improved. Another alternative is to simplify the collimation optics of the slow axis SAC, wherein the size of the device is diminished and the structure is simplified. The size of the device can be diminished if needed, also with a suitable lens that is positioned in front of the slow-axis collimating optics SAC and that splits the slow axis, wherein the slow-axis collimating optics SAC can be positioned closer to the lasers.

The collimating optics of the slow axis SAC can also be absent in case the purpose of use allows a beam of a lower quality. Also the requirements for the collimation optics FAC of the fast axis can then be lowered.

In case the maximum power and/or the necessary power density are not critical factors, the structure of the prior art invention can be simplified by omitting the polarization and/or wavelength multiplexing. At its most simplified version the device can thus contain laser towers KT that emit the same wavelength (wavelength band) in a circular formation.

Figure 6:
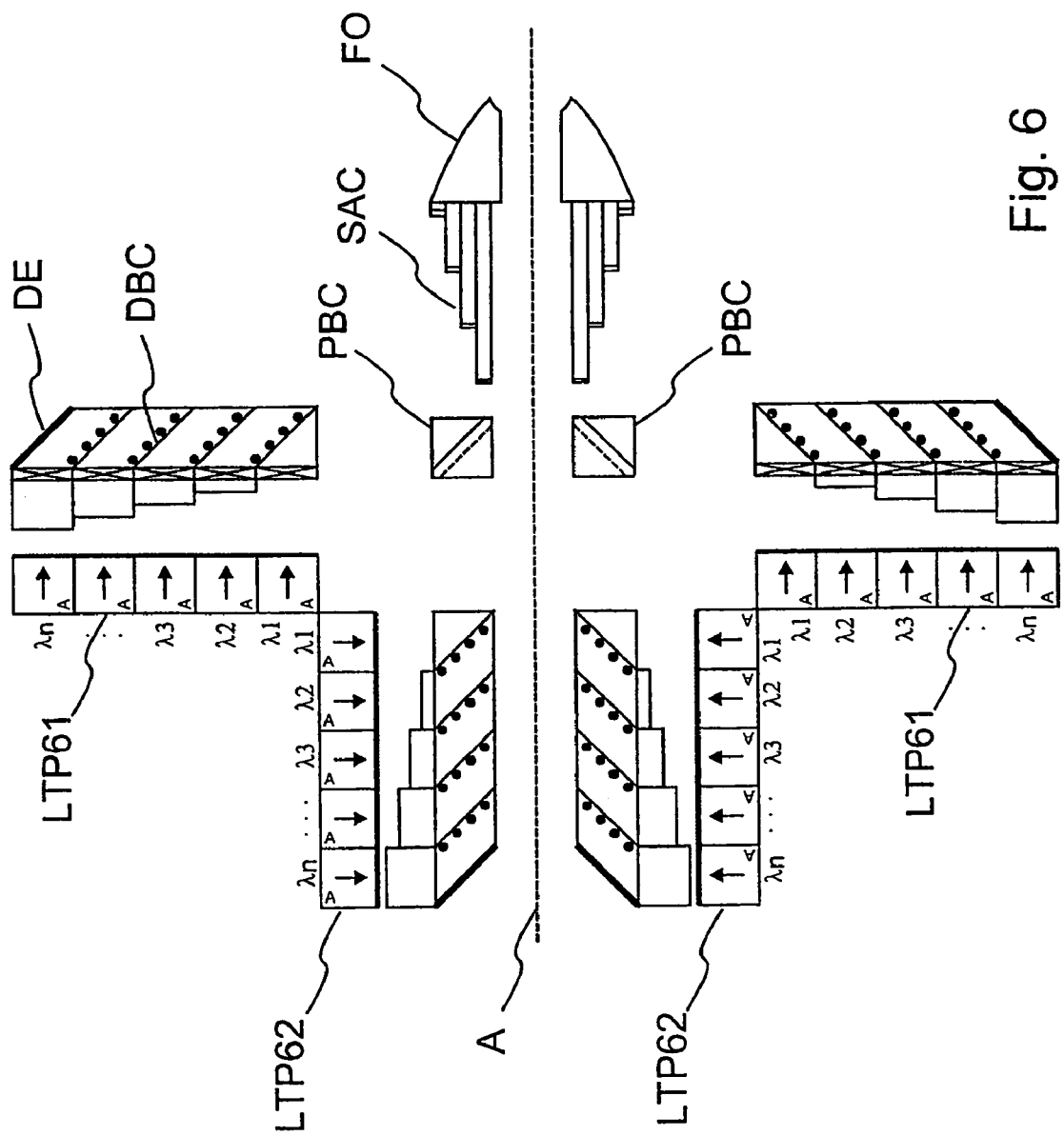
FIG. 6 shows, in a principle manner, another embodiment of the invention.

Embodiment According to FIG. 6

FIG. 6 describes one embodiment of the invention, in which all above-mentioned multiplexing methods are utilized simultaneously. In each sector laser the tower piles LTP61 and LTP62 manufactured of laser towers LT are positioned to two directions that are perpendicular against each other and said laser tower piles can be identical with each other. The laser tower piles LTP61 and LTP62 can be coupled in series for cooling, and they comprise suitable optical elements for compensation. The polarization planes of the second laser tower pile LTP61 are turned 90°, whereafter the beams can be combined by using the polarization beam combiner. The slow axis can be collimated by one step-like pile of lenses SAC after the beams have been combined. Another alternative is to provide each laser tower or laser tower pile with an individual collimation optics SAC of the slow axis.

Also in this solution the structure can be simplified in a manner allowed by the purpose of use. The polarization multiplexing (elements P and PBC) can e.g. be omitted or an alternative is to couple new wavelengths, wherein a dichroic beam combiner DBC, i.e. a dichroic mirror suitable for the purpose, replaces the polarization beam combiner PBC. There can naturally be two or multiple sectors.

Embodiment According to FIGS. 7a and 7b

The embodiment shown in FIGS. 7a and 7b in which the laser towers LT71 and LT72 having the same wavelength and positioned on each sector on the sides of the polarization beam combiner PBC together form an angle of substantially 90°. In addition, the figures describe a novel manner to carry out wavelength multiplexing. For clarity, the polarization beam combiners PBC and the polarization rotating elements P have been omitted from FIG. 7a, wherein the drawing marks of the laser towers LT are more clearly shown. The same practice has been applied later also in FIG. 10.

The beams of the laser towers LT71 and LT72 coming from the different sides are combined in the polarization beam combiner PBC, when the polarization plane of the beam coming from the second laser tower LT71 is rotated first in the rotation element P 90° (λ/2 plate) of polarization. A light beam combined after the polarization beam combiner PBC proceeds to the compensation element C and further to the mirror element 71, which includes a direction turning element DE and dichroic beam combiners DBC. The mirror element 71 forms an angle of preferably 45° with the optical axis A.

The beam continues from the turning element DE axially towards the dichroic beam combiner DBC, where its direction is changed towards the optic axis A. The beam comes out from the right side of the mirror element 71 after having reflected in the dichroic beam combiners DBC and in the direction turning element DE. The dichroic beam combiners DBC of the mirror element 71 operate in a manner that they let through the radially propagating beams and reflect the axially propagating beams. The combined beams of different wavelengths exit from the right side of the mirror element 71 and continue towards the possible collimation optics of the slow axis SAC and focusing FO.

The dichroic surfaces of the mirror element 71 can be made e.g. using multiple evaporations for different areas or, in an alternative manner, the element can be manufactured by combining separate elements (dotted lines in element 71).

The compensation element C after the polarization beam combiner PBC can be triangular in accordance with FIG. 7a. An alternative is to implement an optimal form for each compensation element C separately. The compensation can be carried out also by changing the positioning of the laser towers LT.

In this solution as well there can be one or multiple wavelengths and, in addition, the polarization multiplexing can be omitted at the cost of efficiency to simplify the structure. The polarization rotating element P can be avoided e.g. by using a so-called Thompson prism as the polarization beam combiner.

Other Possible Structures

FIG. 10 shows one possible way for wavelength multiplexing of the laser towers LT. The polarization multiplexing is carried out using the arrangement according to FIGS. 7a and 7b, but the wavelength multiplexing is implemented with dichroic beam combiners DBC having heterogeneous shapes.

The collimation optics SAC of the slow axis have been placed directly after the laser tower piles LTP, which enables the best compensation. As said collimation element of the slow axis SAC can be used one cylindrical lens, or the cylindrical lens pile according to FIGS. 8a to 8c. In order to diminish the structure, between the laser towers LT and the cylindrical lens piles can be placed a lens that diverges the slow axis. Also in this structure the collimation optics SAC of the slow axis can be combined and brought in front of the focusing optics FO.

FIG. 11 shows a structure where four different wavelengths are combined with a compact structure without polarization multiplexing. As an alternative, if $\lambda 1=\lambda 2$ and $\lambda 3=\lambda 4$, it is possible to combine together $\lambda 1$ and $\lambda 2$ as well as $\lambda 3$ and $\lambda 4$ by means of the polarization rotating elements P and polarization beam combiners PBC. The beams combined with polarization multiplexing can be further combined with the dichroic beam combiner DBC. For the collimation of the slow axis SAC two collimation elements according to FIGS. 8a to 8c or single cylindrical lenses are used. Another alternative is to implement the collimation of the slow axis SAC directly in the direction of the laser tower LT and the beam between the first dichroic element DBC.

FIG. 12 shows an alternative implementation of wavelength multiplexing where beams of pile LTP of laser towers that have been collected on top of each other are combined radially. A parallelogram 121 can correspond to the mirror element 71 of FIG. 7a. Alternatively, the dichroic mirror surfaces can be located in triangular optical elements, wherein the parallelogram 121 can be an ordinary waveguide using total internal reflection. In this alternative implementation it is possible to add suitable optical elements for the compensation.

Figure 13:
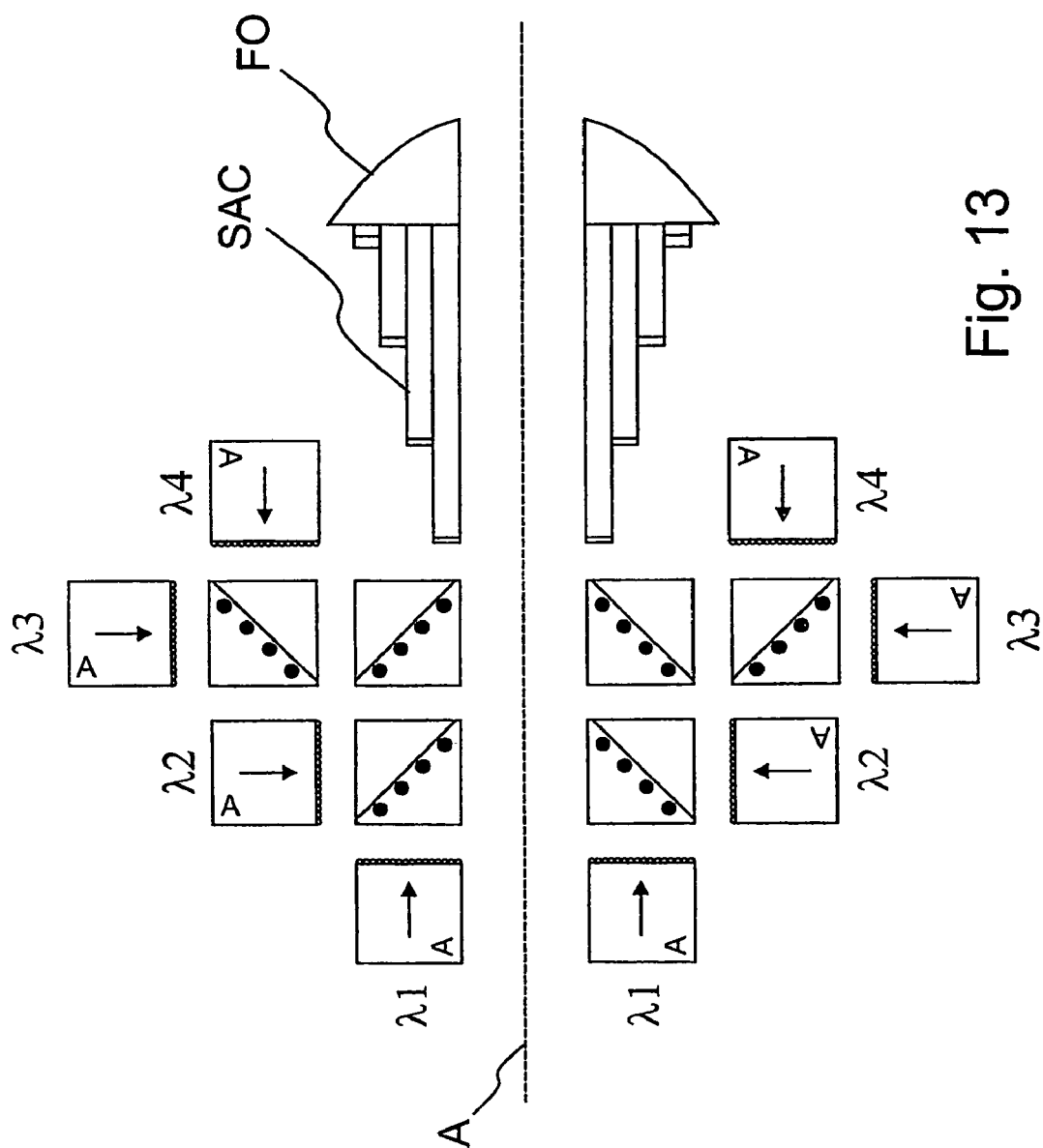
FIG. 13 shows, in a principle manner, a seventh embodiment of the invention.

FIG. 13 illustrates a compact structure for four wavelength multiplexing. As an alternative, if $\lambda 1=\lambda 2$ and $\lambda 3=\lambda 4$, it is possible to combine together $\lambda 1$ and $\lambda 2$ as well as $\lambda 3$ and $\lambda 4$ by means of the polarization rotating elements P and polarization beam combiners PBC. The beams combined with polarization multiplexing can be further combined with the dichroic beam combiner DBC.

By combining the practices described in connection with the above-mentioned embodiments of the invention and the structures of the system in different manners it is possible to implement different embodiments of the invention within the spirit of the invention. Thus, the above-mentioned examples should not be interpreted to restrict the invention, but the embodiments of the invention can vary freely within the scope of the inventive features presented hereinafter in the claims.

It is e.g. obvious that the laser towers LT emitting different wavelengths λ1 to λn to the laser tower pile LTP of a certain sector can be placed to an optimal order in view of compensation. For example, lasers of a wavelength that diverge slower in the direction of the slow axis can be placed further from the focusing optics FO than lasers of a faster diverging wavelength. By positioning of the laser towers in the laser tower pile LTP it is possible to compensate also different dispersion properties of different wavelengths.

The invention claimed is:

1. A method for producing high optical power density, said method comprising:
    combining laser beams emitted from a plurality of laser bars by spatial multiplexing to become substantially parallel with an optical axis, each single laser bar comprising one or more diode lasers, slow axes of adjacent diode lasers of said single laser bar being substantially parallel with each other and said adjacent diode lasers emitting substantially to a same direction, wherein said laser bars are arranged in three or more sectors around said optical axis, a direction of the slow axes of the laser diodes in a first laser bar is substantially different from a direction of the slow axis of the laser diodes in a second laser bar, light emitting surfaces of all diode lasers of at least one of the laser bars are arranged on an area, the width of the area is less than 2.5 millimeters in a direction of the slow axis of the diode lasers of said at least one laser bar, said width being determined at a surface of said laser bar.

2. The method according to claim 1, wherein in a single sector the laser bars are positioned in a manner that their slow axes form a substantially right angle relative to the optical axis and to a normal of the optical axis.

3. The method according to claim 1, wherein in a single sector laser bars are collected on top of each other to form one or a plurality of laser towers.

4. The method according to claim 3, wherein in a single sector laser towers are collected on top of each other to form one or a plurality laser tower piles.

5. The method according to claim 1, wherein in a single sector is used diode lasers of a plurality of different wavelengths.

6. The method according to claim 1, wherein the laser bars are formed in the direction of the slow axis to be narrow in a manner, and wherein radiation can in the direction of said slow axis be directed to a target without narrowing or piling of the beam in the direction of the slow axis.

7. The method according to claim 1, wherein in a single sector radiation of the laser bars is combined further by polarization multiplexing.

8. The method according to claim 1, wherein in a single sector radiation of the laser bars is combined further by wavelength multiplexing.

9. The method according to claim 1, wherein radiation of laser bars is collimated in a direction of a fast axis before the beams are combined with spatial, polarization or wavelength multiplexing.

10. The method according to claim 1, wherein in a single sector properties of the beams that have left from different locations relative the optical axis are compensated in view of effects of path length difference, divergence or wavelength.

11. The method according to claim 10, wherein said compensation is carried out before the beams are combined to a combined beam parallel with the optical axis.

12. The method according to claim 1, wherein the combined beam parallel with the optical axis is focused with axial symmetrical lens, mirror or diffractive optics.

13. The method according to claim 12, wherein the focusing is carried out using axially symmetrical paraboloid mirror optics.

14. The method according to claim 12, wherein radiation is collimated in the direction of slow axis before the combined beam is focused.

15. The method according to claim 1, wherein a free area surrounding the optical axis remaining in a middle of an axial symmetrical structure is used in monitoring of the target.

16. The method according to claim 1, wherein through a free area surrounding the optical axis remaining in a middle of an axial symmetrical structure material needed in processing of an object is introduced or material that is present in the processing of the object is removed.

17. A laser device, comprising:
    a plurality of laser bars each comprising one or more diode lasers, each laser diode comprising a slow axis, the slow axes of adjacent diode lasers of each laser bar being substantially parallel with each other, said adjacent diode lasers emitting substantially to the same direction, wherein a direction of the slow axis of the diode lasers in a first laser bar is substantially different from a direction of the slow axis of the diode lasers in a second laser bar, wherein light emitting surfaces of all diode lasers of at least one of the laser bars are arranged on an area have a width that is less than 2.5 millimeters in a direction of the slow axes of the diode lasers of said at least one of said laser bars, and wherein said width is determined at a surface of said at least one of said laser bars; and
    means for combining laser beams emitted from said laser bars by spatial multiplexing to one or more beams propagating substantially parallel with an optical axis of said device, wherein said laser bars are arranged in three or more sectors around said optical axis.

18. The laser device according to claim 17, wherein in a single sector the laser bars are arranged in a manner that their slow axes form a substantially right angle relative to the optical axis and to a normal of the optical axis.

19. The laser device according to claim 17, wherein in a single sector laser bars are collected on top of each other to form one or a plurality of laser towers.

20. The laser device according to claim 19, wherein in a single sector laser towers are collected on top of each other to form one or a plurality laser tower piles.

21. The laser device according to claim 17, wherein in a single sector is used diode lasers of a plurality of different wavelengths.

22. The laser device according to claim 17, wherein the laser bars are formed in the direction of the slow axis to be narrow in a manner that radiation can in the direction of said slow axis be directed to an object without narrowing or piling of the beam in the direction of the slow axis.

23. The laser device according to claim 22, wherein said narrow laser bar comprises less than 10 pieces of adjacent diode lasers.

24. The laser device according to claim 17, wherein a single sector comprises means for combining the radiation of the laser bars of said sector by polarization multiplexing.

25. The laser device according to claim 17, wherein a single sector comprises means for combining the radiation of the laser bars by wavelength multiplexing.

26. The laser device according to claim 17, wherein radiation of laser bars is arranged to be collimated in direction of a fast axis before the beams are combined with spatial, polarization or wavelength multiplexing.

27. The laser device according to claim 17, wherein a single sector comprises means for compensating properties of the beams that have left from different locations relative the optical axis in view of path length difference, divergence or wavelength.

28. The laser device according to claim 17, wherein in a single sector a distance of single laser bars from the optical axis is arranged to compensate properties of the beams that have left from different locations in a direction of the optical axis in view of path length difference, divergence or wavelength.

29. The laser device according to claim 27, wherein said compensation is arranged to be carried out before the beams are combined to a combined beam parallel with the optical axis.

30. The laser device according to claim 29, further comprising:
focusing means based on lens or minor optics for focusing the combined beam in a direction of the optical axis axial symmetrically.

31. The laser device according to claim 30, wherein said focusing means are based on axially symmetrical paraboloidic mirror optics.

32. The laser device according to claim 30, further comprising:
collimating means for collimating radiation in the direction of the slow axis, said means for collimating being arranged in a direction of the beam before said focusing means.

33. The laser device according to claim 32, wherein said means for collimating the beam in the direction of the slow axis comprise a sector-like cylindrical lens pile.

34. The laser device according to claim 19, wherein in at least one sector of said two or more sectors the distance of said laser towers from the optical axis is arranged to compensate properties of laser beams that have left from different locations in the direction of the optical axis in view of path length difference, divergence or wavelength.

35. The laser device according to claim 17, wherein at least one laser bar comprises less than 5 pieces of adjacent diode lasers.

36. The laser device according to claim 19, wherein at least one laser bar comprises less than 10 pieces of adjacent diode lasers.

37. The laser device according to claim 19, wherein radiation of at least one of said laser bars is arranged to be collimated in a direction of a fast axis before the beams are combined with spatial, polarization or wavelength multiplexing.

38. The laser device according to claim 37, further comprising:
means for collimating at least one laser beam in the direction of the slow axis, said means for collimating comprising a sector-like cylindrical lens pile.

39. The laser device according to claim 38, wherein at least a single sector of said two or more sectors further comprises means for compensating properties of laser beams that have left from different locations relative the optical axis in view of path length difference, divergence or wavelength, said compensation being arranged to be carried out before said laser beams are combined to a combined beam parallel with the optical axis.

40. The method according to claim 1, further comprising:
focusing the laser beams parallel to the optical axis with a focusing element to form a focal spot located at the optical axis, wherein said focusing element comprises a hole such that a free space remains in the vicinity of said optical axis.

41. The device according to claim 17, further comprising:
a focusing element configured to focus the laser beams parallel to the optical axis to form a focal spot located at the optical axis, wherein said focusing element comprises a hole such that a free space remains in the vicinity of said optical axis.

* * * * *